United States Patent [19]

Sleffel

[11] Patent Number: 4,700,568

[45] Date of Patent: Oct. 20, 1987

[54] PULSE ACCUMULATOR NETWORK ADAPTED FOR USE IN A FLOW MONITORING SYSTEM

[75] Inventor: William M. Sleffel, Edmond, Okla.

[73] Assignee: Kerr-McGee Corporation, Oklahoma City, Okla.

[21] Appl. No.: 838,591

[22] Filed: Mar. 11, 1986

[51] Int. Cl.[4] ............................................. G01F 1/00
[52] U.S. Cl. ..................................... 73/195; 377/21; 364/510; 340/518; 361/407
[58] Field of Search ........................... 377/21; 73/195; 340/518; 364/510, 465; 361/407

[56] References Cited

U.S. PATENT DOCUMENTS

| | | | |
|---|---|---|---|
| 3,598,283 | 8/1971 | Krutz | 377/21 |
| 3,752,393 | 8/1973 | Moseley | 364/510 |
| 4,051,998 | 10/1977 | Zabel | 377/21 |
| 4,087,858 | 5/1978 | Pichler et al. | 364/465 |
| 4,238,825 | 12/1980 | Geery | 377/21 |
| 4,257,275 | 3/1981 | Kurita et al. | 364/510 |
| 4,334,124 | 6/1982 | Imsand et al. | 364/520 |
| 4,372,167 | 2/1983 | Loveland | 364/510 |
| 4,414,633 | 11/1983 | Churchill | 364/510 |
| 4,481,503 | 11/1984 | Lehman et al. | 73/195 |
| 4,604,678 | 8/1986 | Hagner | 361/407 |

Primary Examiner—John S. Heyman
Attorney, Agent, or Firm—William G. Addison

[57] ABSTRACT

A pulse accumulator network for receiving a plurality of pulse trains wherein each pulse train includes a plurality of pulses. The pulse accumulator network accumulates the pulses in each of the received pulse trains and the pulse accumulator network outputs each of the accumulated count of pulses in response to receiving polling signals. The pulse accumulator network is adapted to be utilized in a flow monitoring system, for example, wherein the pulse trains are flow signals indicative of the velocity of the fluid flowing through one of the monitored flowlines.

19 Claims, 9 Drawing Figures

PULSE ACCUMULATOR NETWORK ADAPTED FOR USE IN A FLOW MONITORING SYSTEM

BACKGROUND OF THE INVENTION

Field of the Invention

The present invention relates generally to pulse accumulators and, more particularly, but not by way of limitation, to a pulse accumulator network adapted for receiving pulses indicative of the velocity of the fluid flowing through monitored flowlines and for accumulating such received pulses, the accumulated pulses being sampled on a periodic basis.

BRIEF DESCRIPTION OF THE DRAWINGS

FIGS. 4a, 4b, 4c and 4d are a detailed schematic view of one particular embodiment of the pulse accumulator network of FIGS. 1, 2 and 3.

BRIEF DESCRIPTION OF THE PREFERRED EMBODIMENTS

Described in detail in U.S. Pat. Ser. No. 4,481,503, issued to Lehman, et al. and U.S. Pat. Ser. No. 4,562,739, issued to Lehman, et al., both assigned to the assignee of the present invention, was a production monitoring system wherein fluid flow through a plurality of monitored flowlines was monitored, the disclosures of these two patents specifically being incorporated herein by reference and the systems described therein being generally referred to herein as the Prior Production Monitoring System. In this Prior Production Monitoring System, a transducer was connected to each of the monitored flowlines and each of the transducers produced a flow signal indicative of the velocity of the fluid flowing through the monitored flowline. The flow signals were carried by a cable to a surface location wherein the flow signals were processed to produce production flow characteristic profiles, each production flow characteristic profile representing a unique "fingerprint" of the flow through a particular monitored flowline. Among other things, the production flow characteristic profiles were useful in establishing an alarm value and an alarm delay time for each of the monitored flowlines which were utilized to detect a problem production condition associated with a particular well or, in other words, associated with a particular monitored flowline. The present invention includes an improved pulse accumulator network which may be utilized for receiving and processing the flow signals in such a flow monitoring system.

Figure 1:
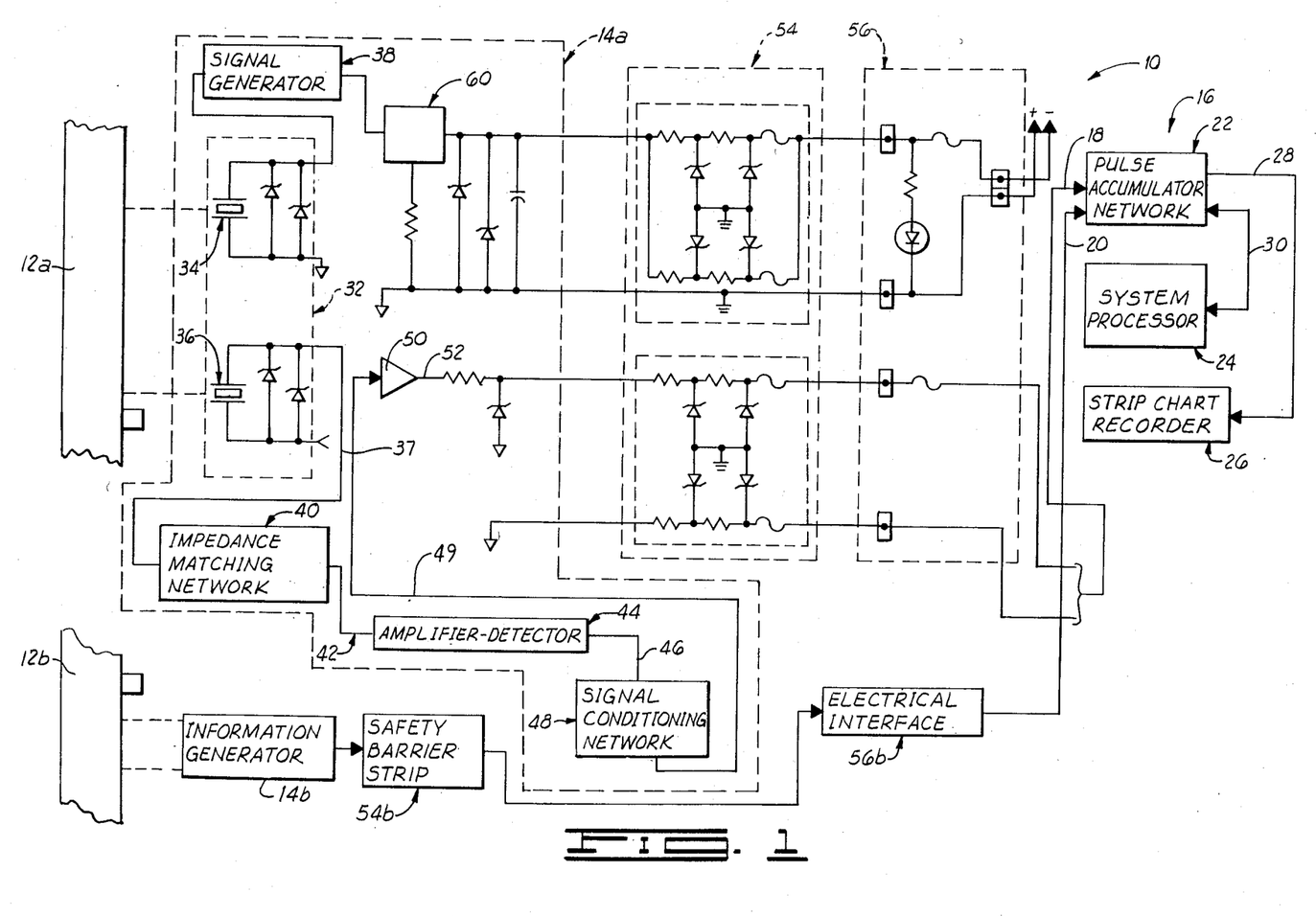
FIG. 1 is a diagrammatic view showing a pulse accumulator network constructed in accordance with the present invention and utilized in a flow monitoring system.

Shown in FIG. 1 is a diagrammatic view of a flow monitoring system 10 which is adapted to monitor the flow of fluid through a plurality of flowlines (monitored flowlines) 12, two flowlines 12a and 12b being shown in FIG. 1. The flow monitoring system 10 also includes a plurality of information generators 14 and a base station control 16 which is remotely located with respect to the information generators 14 and the monitored flowlines 12 associated therewith. Each information generator 14 is operatively connected to one of the flowlines 12 and two information generators 14a and 14b are shown in FIG. 1 operatively connected to the flowlines 12a and 12b, respectively (the connector between the information generators 14 and the flowlines 12 being illustrated by dashed lines in FIG. 1).

In general, each information generator 14 senses or detects the flow of fluid through the monitored flowline 12 associated therewith and each information generator 14 is constructed and adapted to provide an output flow signal (pulse train) in a digital format which is indicative of the velocity of the fluid flowing through the monitored flowline 12. As shown in FIG. 1, the information generator 14a provides an output flow signal indicative of the velocity of the fluid flowing through the monitored flowline 12a on a signal path 18 and the information on generator 14b provides an output flow signal on a signal path 20 indicative of the velocity of the fluid flowing through the monitored flowline 12b.

The flow signals outputted by the information generators 14 are connected to and received by the base station control 16. The base station control 16 comprises a pulse accumulator network 22, a system processor 24 and a strip chart recorder 26.

The pulse accumulator network 22, more particularly, receives the flow signals outputted by the information generators 14 and the pulse accumulator network 22 accumulates the received flow signals in one operational mode. In one other operational mode, the pulse accumulator network 22 receives the flow signals outputted by the information generators 14, converts the received flow signals that are in a digital pulse train format to flow signals in an analog format and outputs selectively one of the flow signals in an analog format relative to one monitored flowline 12 on a signal path 28. The outputted flow signal in an analog format on the signal path 28 is received by the strip chart recorder 26 and the strip chart recorder 26 outputs the received flow signal in a printed format.

The pulse accumulator network 22 receives the flow signals in a digital pulse train format from each of the information generators 14 and the pulse accumulator network 22 accumulates and stores each of the received flow signals in a separate, distinct storage location. More particularly, the pulse accumulator network 22 accumulates and stores the pulses in each of the received flow signals and the accumulated pulses for each of the monitored flowlines are stored in a separate, distinct storage location in the pulse accumulator network 22.

The system processor 24 is programmed to poll each storage location in the pulse accumulator network 22 on a predetermined periodic basis by providing polling signals on a signal path 30, the polling signals provided by the system processor 24 polling each storage location in the pulse accumulator network 22 on a predetermined periodic basis and in a predetermined known polling sequence. In response to receiving a polling signal, the pulse accumulator network 22 outputs on the signal path 30 the accumulated pulses (in a parallel digital format) from the storage location in the pulse accumulator network 22 associated with a particular monitored flowline 12 and the system processor 24 receives the accumulated pulses from each storage location. The system processor 24 is programmed to receive the accumulated pulses from the pulse accumulator network 22 and to determine the velocity of the fluid flowing through the monitored flowline 12 from the received accumulated pulses outputted by the pulse accumulator network 22.

The flow signals in a digital format inputted into the pulse accumulator network 22 have a frequency which is proportional to the velocity of the fluid flowing through the monitored flowline 12 if the fluid flow is single phase. If the fluid flow is multiple phase (including gas bubbles and sand, for example), then, the fluid flow signals inputted into the pulse accumulator network 22 are not proportional to the velocity of the fluid flowing through the monitored flowline 12 in a quantitative sense, but the flow signals inputted into the pulse accumulator network 22 are qualitatively indicative of the velocity of the fluid flowing through the monitored flowline 12. In any event, the pulse accumulator network 22 counts the pulses in each inputted fluid flow signal and accumulates this count. In response to receiving a polling signal from the system processor 24, the pulse accumulator network 22 outputs the accumulated count from the storage location being polled and it is this accumulated count which is outputted by the pulse accumulator network 22 on the signal path 30 for reception by the signal processor 24. The system processor 24 is programmed to know the time period during which the accumulated count was acquired in each storage location and the time period along with the accumulated count provides the information necessary for the system processor 24 to determine the average velocity of the fluid flowing through the monitored flowline 12 during the time period between polling signals, or, in other words, during the time period in which the count of pulses was accumulated in the particular storage location in the pulse accumulator network 22.

The information generators 14 each are constructed exactly alike and only one of the information generators 14a is shown in detail in FIG. 1. Each information generator 14 includes a transducer 32. Each transducer 32 is constructed to emit an ultrasonic sound wave and to receive a reflected sound wave, the emitted and the reflected sound waves being focused on the fluid flowing through the monitored flowline 12 associated with the particular transducer 32.

In a preferred embodiment, each transducer 32 is an ultrasonic Doppler shift transducer. Doppler shift transducers are well known in the art and commercially available from various sources. One ultrasonic Doppler shift transducer which is suitable for use in the present invention is manufactured by Bestobel Meter Flow Ltd. of Baldock, Herts, England, and designated by the Bestobel model designation DS-5, T-30 or P-10, for example. A transducer of this type is constructed to emit a sound wave having a frequency in the ultrasonic range, such as 625 KHz or 640 KHz, for example, and transducers of this type also are constructed to receive reflected signals having the frequency in the ultrasonic range, such as 625 KHz or 640 KHz, for example.

Each transducer 32 includes an ultrasonic emitting crystal 34 and an ultrasonic receiving crystal 36. The emitting crystal 34 is adapted to receive a signal generated by a signal generator 38 and to transmit or emit an ultrasonic frequency signal into the flowline 12 associated therewith. The signal transmitted or emitted into the flowline 12 from the emitting crystal 34 is reflected from particles in the fluid, or gas bubbles, flowing through the flowline 12. The reflected signal is received by the receiving crystal 36 and the receiving crystal 36 outputs the reflected signal on a signal path 37 to an impedance matching network 40. The signal provided by the reflecting crystal 36 is an analog signal and is modulated in relation to the velocity of fluid flowing through the flowline. Thus, each transducer 32 senses or detects the velocity of the fluid flowing through the flowline 12 associated therewith, and each transducer 32 provides an analog output signal which is indicative to the velocity of the fluid flowing through the monitored flowline 12. As shown in FIG. 1, a pair of zener diodes is connected to each crystal 34 and 36 for overvoltage protection.

The flow signals provided by the transducer 32 are outputted on a signal path 37 and received by an impedance matching network 40 wherein the connection across a source of impedance of another source of impedance is accomplished to avoid reflection of the flow signals. The fluid flow signals are outputted by the impedance matching network 40 on a signal path 42 and the outputted flow signals on the signal path 42 are received by an amplifier-detector 44. The amplifier-detector 44 is constructed and adapted to amplify and then to detect and demodulate the received flow signals. The demodulated flow signals are outputted by the amplifier-detector 44 on a signal path 46.

The amplifier-detector 44 outputted flow signals on the signal path 46 are received by a signal conditioning network 48. The signal conditioning network 48 includes an amplifier for amplifying the received flow signals, a low pass filter which is adapted to pass all frequencies below a specified or predetermined frequency with relatively little or no loss, while discriminating against higher frequencies, noise reducing circuitry, and amplified where clipping can be effected to convert the flow signal in an analog format to a flow signal in a digital format (pulse train). The signal conditioning network 48 thus outputs the flow signal in a digital format on a signal path 49.

The flow signals in a digital format outputted by the signal conditioning network 48 on a signal path 49 are connnected to and received by a line driver 50. The line driver 50 outputs the flow signal in a digital format on the signal path 52. The outputted flow signal in a digital format on the signal path 52 passes through a commercially available barrier strip 54a which protects against overcurrent and overvoltage levels. Safety barrier strips, such as the barrier strip 54a shown in FIG. 1, are commercially available and one barrier strip suitable for use in connection with the present invention is manufactured by MTL, Incorporated of England, and designated by the MTL model designation MTL779 or MTL767, for example. The flow signals in a digital format outputted on the signal path 52 also pass through an electrical interface 56a which provides overcurrent protection for the safety barrier 54a.

The flow signals on the signal path 52 are outputted from the information generator 14a on the signal path 18. In a like manner, the flow signals in a digital format generated by the information generator 14b are outputted on the signal path 20, the outputted flow signals in a digital format on the signal paths 18 and 20 being received by the pulse accumulator network 22, as described before. The outputted flow signals on the signal path 20 also pass through a barrier strip 54b and an electrical interface 56b for reasons identical to those described before with respect to the barrier strip 54a and the electrical interface 56a.

The signal generator 38 in the information generator 14 is connected to a power supply (not shown) by way of a voltage regulator 60 and the safety barrier strip 54 and the electrical interface 56, shown in FIG. 1. It should be noted that the impedance matching network 40, amplifier-detector 44, signal conditioning network 48 and the line driver 50 also are connected (not shown) to the power supply (not shown) by way of the voltage regulator 60. The safety barrier strip 54 and the electrical interface 56 providing overvoltage and overcurrent protection for reasons mentioned before.

Each information generator 14 is constructed exactly like the information generator 24a described in detail before. In the Prior Production Monitoring System, the transducer was mechanically connected to the flowline and the transducer flow signal in an analog format was communicated to the surface and processed. It was found that this particular mode of operation resulted in significant noise in the communicated flow signal from various sources which interfered with accurate signal processing.

As shown in FIG. 1, all of the components of the information generator 14 are located at the flowline 12. In fact, in one preferred embodiment, all of the components of each of the information generators 14 shown in FIG. 1 are housed in appropriate housings which are physically connected to one of the flowlines 12. In those instances where the flowline 12 is connected to a manifold and a check valve is included in the flowline 12 to prevent backflow, the components of each of the information generators 14, except the emitting crystal 34 and the receiving crystal 36 and associated zener diodes are mounted on one circuit board, housed, and located on the downstream side of the check valve, and the emitting crystal 34 and the receiving crystal 36 and associated zener diodes are mounted in a separate housing, encapsulated and connected to the electronics by way of a cable, the emitting crystal 34 and receiving crystal 36 connected externally to the flowline 12 upstream from the check valve to prevent backflow vibrations from interfering with the emitted and reflected signals.

Figures 2, 3:
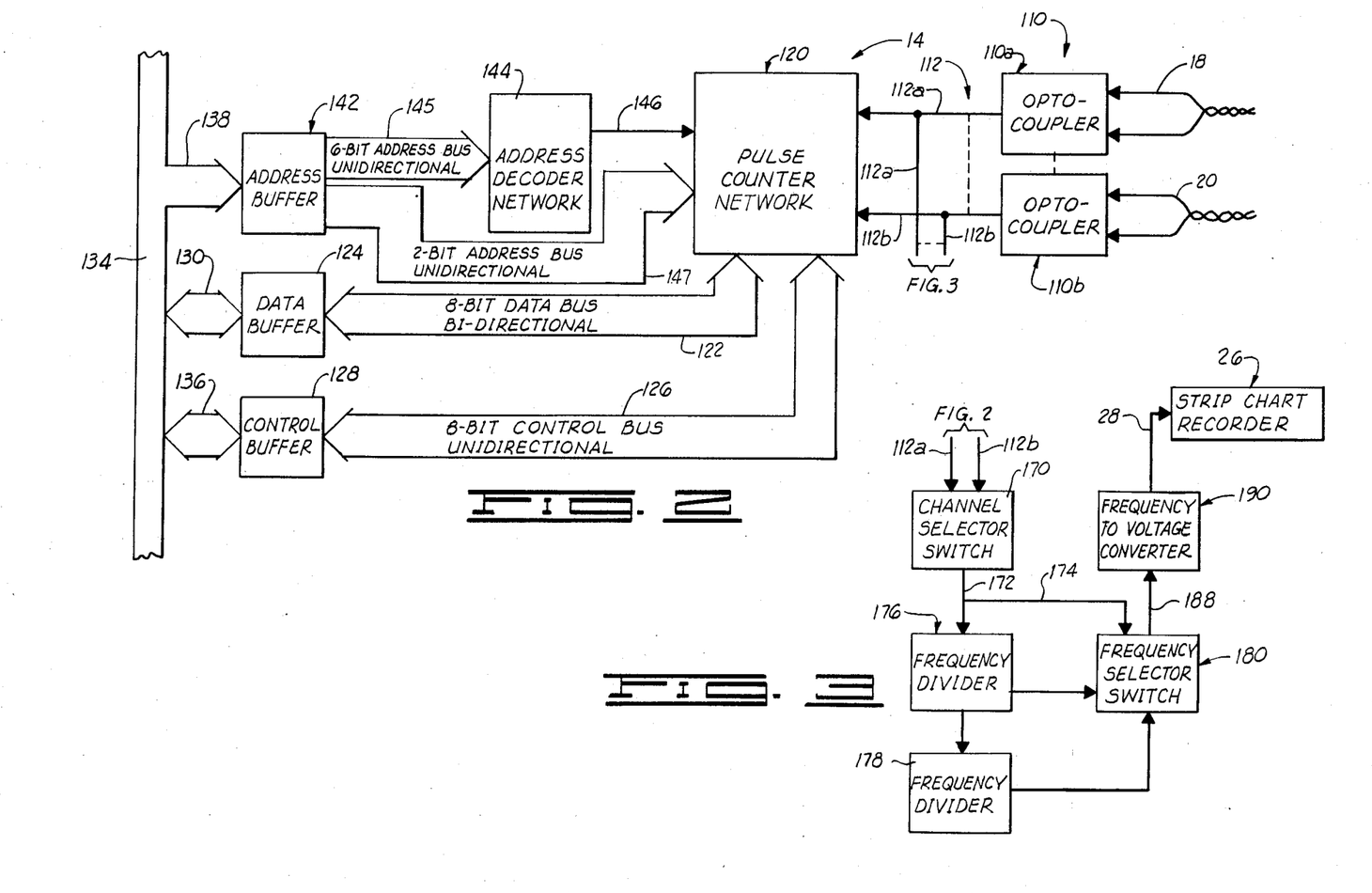
FIG. 2 is a diagrammatic view of a portion of the pulse accumulator network of FIG. 1.
FIG. 3 is a diagrammatic drawing illustrating the remaining portion of the pulse accumulator network of FIG. 1.

EMBODIMENT OF FIGS. 2 AND 3

A typical pulse accumulator network 22 is shown in xore detail in FIGS. 2 and 3. The pulse accumulator network 22 includes a plurality of optical couplers 110 and each optical coupler 110 is connected to one of the information generators 14 for receiving the flow signals outputted by the information generator 14 connected thereto. As shown in FIG. 2, the optical coupler 110a receives the flow signal outputted by the information generator 14a on the signal path 18 and the optical coupler 110b receives the flow signal outputted by the information generator 14b on the signal path 20, the dashed lines in FIG. 2 between the optical couplers 110a and 110b indicating the presence of more than two optical couplers 110 and the optical couplers 110a and 110b each are identified in FIG. 2 as "opto-coupler". The construction and operation of optical couplers such as the optical couplers 110 are well known in the art and one optical coupler suitable for operating with the information generator 14 in the manner described before with respect to the optical couplers 110 is commercially available from Hewlett Packard Corporation of Palo Alto, Calif., and designated by the Hewlett Packard model number HCPL2602.

The optical couplers 110 each provide the received flow signals on an output signal path 112. More particularly, the optical coupler 110a outputs the flow signal on the signal path 112a and the optical coupler 110b outputs the flow signal on a signal path 112b, as shown in FIG. 2. As shown in FIG. 2, there are a plurality of output signal paths 112 (indicated by the dashed lines between the signal paths 112a and 112b) and each of these signal paths 112 is connected to an optical coupler 110 for receiving flow signals outputted by an information generator 14. In one preferred embodiment, the flow monitoring system 10 includes eight information generators 14 and the pulse accumulator network 22 includes eight optical couplers 110 with each optical coupler 110 receiving the flow signal outputted by one of the information generators 14 and with each optical coupler 110 outputting the received flow signal on a signal path 112, for example.

The flow signals outputted from the optical couplers 110 on the signal paths 112 are received by a pulse counter network 120. The pulse counter network 120 receives the flow signals in a digital format and is constructed to count the received pulses and accumulate this count, the accumulated count representing an accumulated flow signal being stored in a predetermined specific identifiable storage location in the pulse counter network 120. More particularly, the pulse counter network 120 includes a plurality of pulse accumulators (not shown in FIG. 2) and each pulse accumulator in the pulse counter network 120 is connected to one of the signal paths 112. Thus, each pulse accumulator in the pulse counter network 120 receives the flow signal on one of the signal paths 112 and each pulse accumulator in the pulse counter network 120 accumulates the count of pulses in the received flow signal, each pulse accumulator thus storing the accumulated count of one of the flow signals in a specific storage location identified by the particular pulse accumulator, per se. In one preferred embodiment, the pulse accumulators each are set at a predetermined number of counts and each pulse accumulator is adapted to downcount in response to each received pulse in the received flow signal. In this embodiment, the count in each pulse accumulator in the pulse counter network 120 at any given time subtracted from the predetermined or preset initial count represents the number of pulses counted by the pulse accumulator since the resetting of that pulse accumulator. In this embodiment, each pulse accumulator preferably comprises two 8-bit downcounters and these downcounters are arranged for outputting the accumulated count in the counters as a 16-bit data signal, the 16-bit data signal representing the accumulated count in the counter and being indicative of the average velocity of the fluid flowing through the monitored flowline connected to that pulse accumulator over the period of time since the resetting of that pulse accumulator and the sampling, or polling of that pulse accumulator, this time period being sometimes referred to herein as the period of time between polling signals, or the predetermined time interval, or the polling period of time. If a particular pulse accumulator in the pulse counter network 120 initially is set with all zeroes, the accumulated count in binary form can be manipulated by a 2's compliment by the system processor 24 to determine the average velocity of the fluid flowing through the monitored flowline 12 over the polling period of time. By the same token, if the pulse accumulator initially is preset with all ones, the accumulated count in binary form can be manipulated by a 1's compliment by the system processor 24 to determine the average velocity of the fluid flowing through the monitored flowline 12 over the polling period of time.

An 8-bit bi-directional data bus 122 connects the pulse counter network 120 to a data buffer 124. An 8-bit uni-directional control bus 126 connects the pulse counter network 129 to an associated control buffer 128. An 8-bit bi-directional data bus 130 connects the data buffer 124 to an STD bus compatible interconnect 134. An 8-bit uni-directional control bus 136 connects the control buffer 128 to the STD bus compatible interconnect 134. An 8-bit address bus connects the STD bus compatible interconnect 134 to an address buffer 142 and the address buffer 142 is connected to an address decoder network 144 by way of a 6-bit uni-directional address bus 146. The address decoder network 144 is connected to the pulse counter network 120 by way of a signal path 146. The address buffer 142 is connected to the pulse counter network 120 by way of a 2-bit uni-directional address bus 147. The address decoder network 144 contains a plurality of address decoders in on preferred embodiment.

It is significant to note that the pulse accumulator network 22 includes a pulse counter network 120 which is connected to the STD bus compatible interconnect 134 and thus, in one aspect, the present invention also contemplates the pulse counter network 120 mounted on a circuit board with the STD bus compatible interconnect 134 thereby making the unit comprising the pulse counter network 120 readily utilizable with other system modules since there are numerous commercially available system modules adapted for connection with an STD bus. The STD bus compatibility is well known in the art.

The 8-bit control bus 126 is connected to each of the pulse accumulators in the pulse counter network 120 and the 8-bit data bus 122 also is connected to each of the pulse accumulators in the pulse counter network 120. The STD bus compatible interconnect 134 is connected to the system processor 24 (general purpose digital computer or microprocessor such as Zilog, Z80) thereby connecting the pulse counter network 120 to the system processor 24.

As mentioned before, the system processor 24 is programmed to poll each of the pulse accumulators in the pulse counter network 120 and to receive the accumulated count in each such polled pulse accumulator, each pulse accumulator more particularly providing downcount data, the downcount data being the number of pulses counted in the received flow signal subtracted from a predetermined number over the polling period of time when such downcount data is manipulated in the manners described before.

As mentioned before, each of the pulse accumulators in one embodiment comprise two interconnected 8-bit downcounters and each pulse accumulator has an address code uniquely identifying that particular pulse accumulator, or, in other words, identifying the storage location of the data stored in the particular pulse accumulator. This address code, along with the information identifying the particular flowline 12, and the particular information generator 14 associated therewith and providing the flow signals to that particular pulse accumulator, is stored in the system processor 24. Thus, the system processor 24 has stored therein information to address any one of the pulse accumulators in the pulse counter network 120 and to associate that pulse accumulator with a particular flowline 12.

In operation, the system processor 24 provides the polling signals and the polling signals are connected to the pulse counter network 120 by way of the 8-bit address bus 138, the address buffer 142, 6-bit address bus 145, the address decoder network 144, the 2-bit address bus 147 and the signal path 146. Thus, each of the polling signals includes the address code of the particular pulse accumulator to be polled and this polling signal, including the address code, is received by the address decoder network 144. The address decoder network 144 decodes the received address code and provides an output signal on the signal path 146 to enable the particular pulse accumulator uniquely identified by the received address code when that particular pulse accumulator also receives the 2-bit address code over the 2-bit address bus 147, or, in other words, conditions the particular pulse accumulator uniquely identified by the address code in a condition for downloading the accumulated downcount contained in that particular pulse accumulator to the system processor 24.

The polling signal also includes a control signal and the control signal is connected to the pulse counter network 120 by way of the control bus 136, the control buffer 128 and the 8-bit control bus 126. When the particular pulse accumulator is enabled, as a result of the signal received from the address decoder 144, the particular pulse accumulator also is conditioned to receive control signals over the 8-bit control bus 126. The control signal instructs the enabled pulse accumulator to download the accumulated downcount contained in that particular pulse accumulator. The particular pulse accumulator enabled by the address decoder 144 and by the 2-bit address bus 147 downloads the accumulated downcount contained therein in response to the control signals and in response to being enabled. The accumulated downcount is downloaded to the system processor 24 by way of the 8-bit data bus 122, the data buffer 124, the data bus 130 and the STD bus compatible interconnect 134.

After the accumulated downcount in the pulse accumulator has been downloaded to the system processor 24, the pulse accumulator is reset to the initial predetermined count. The pulse accumulator is selected to receive the initial predetermined count by the address code (the last 2-bits in the address code which were connected to the pulse accumulator by way of the 2-bit address bus and control signals passed to the pulse accumulator over the central bus 126 instructing the pulse accumulator to receive the initial count). The initial count then is outputted from the system processor 24 and connected to the pulse accumulator in the pulse counter network 120 by way of the STD bus compatible interconnect 134, the data bus 130, the data buffer 124 and the 8-bit data bus 122. After being reset, the pulse accumulator again is conditioned to downcount the pulses in the received flow signal.

This process is continued until the system processor 24 has polled each of the pulse accumulators in the pulse counter network 120 and downloaded the downcount contained therein and, then, the system processor 24 repeats this polling function. In one operational embodiment, each pulse accumulator in the pulse counter network 120 is polled every second or, in other words, the system processor 24 receives a downcount indicative of the velocity of the fluid flowing through each of the monitored flowlines 12 every second. The system processor 24 is programmed with the polling period of time (the elapsed time between when the particular pulse accumulator was last polled and the present polling of that pulse accumulator) and, with this information relating to the polling period of time and the downcount received from the particular pulse accumulator, the system processor 24 is programmed to determine the average velocity of the fluid flowing through the monitored flowline 12 which caused the flow signals to be provided to the particular polled pulse accumulator in the pulse counter network 120.

In one mode of operation, each pulse accumulator in the pulse counter network 120 is conditioned to output an interrupt signal, which includes the address code identifying the particular pulse accumulator, over the 8-bit data bus 122 to the system processor 24 when such pulse accumulator has downcounted to zero. Thus, the interrupt signal informs the system processor 24 that a particular pulse accumulator identified by the address code in the interrupt signal has downcounted to zero. In response to receiving the interrupt signal, the system processor 24 is programmed to output a polling signal for polling the pulse accumulator identified by the address code in the received interrupt signal.

As mentioned before in connection with the description of FIG. 1, the flow monitoring system 10 also is able to provide an analog strip chart print showing the relative velocity of the fluid flowing through the monitored flowline 12 as a function of time. In this mode of operation, each of the flow signals received from the information generators 14 is inputted into a channel selector switch 170 by way of the signal paths 112, as shown in FIGS. 2 and 3. The channel selector switch 170 is adapted to manually select one of the signal paths 112 or, in other words, to select one particular flow signal generated by one particular information generator 14 and to output only the selected flow signal, the channel selector switch 170 outputting the selected flow signal on a signal path 172, as shown in FIG. 3. The outputted flow signal is connected to two frequency dividers 176 and 178 and the outputted flow signal from the channel selector switch 170 also is connected to a frequency selector switch 180 by a signal path 174.

The manual frequency selector switch 180 selects the desired setting for each of the frequency dividers 176 and 178 or, in other words, each of the frequency dividers 176 and 178 is constructed and adapted to divide the frequency of the inputted flow signal by any one of a predetermined number of divisors, the frequency selector switch 180 more particularly selecting the divisor to be utilized by each of the frequency dividers 176 and 178. After the flow signal frequency has been divided by the frequency dividers 176 and 178, the flow signal then is outputted through the frequency selector switch 180 on a signal path 188. The outputted flow signal on the signal path 188 is received by a frequency to voltage converter 190 wherein the frequency of the outputted signal path is converted to a voltage, thereby in essence converting the flow signal in a digital format to a flow signal in an analog format compatible with a particular commercially available chart recorder. The flow signal in an analog format is outputted by the frequency to voltage converter on a signal path 28 and received by the strip chart recorder 26, the strip chart recorder 26 outputting the received flow signal in an analog format in a strip chart format, as generally described before in connection with FIG. 1.

In one particular embodiment, the frequency divider 176 is constructed to divide the frequency of the inputted signal by either 2, 4, 8 or 16, and the frequency divider 178 is constructed and adapted to divide the frequency of the inputted signal by either 32, 64, 128 or 256 by way of user hard wire strapping. The frequency selector switch 180 is a nine position switch designated on the switch as positions 1, 2, 3, 4, 5, 6, 7, 8 and 9. The frequency divisor in this instance would be 2 raised to the $(n-1)$ power where n equals the switch position. Thus, the frequency selector switch 180 can select any one of the four divisor options for each of the frequency dividers 176 and 178 or a divisor of divide by one option thereby selecting to pass the flow signal on the signal path 174. In this embodiment, the frequency to voltage converter 190 is constructed and adapted to convert the frequency of the received flow signal from a digital format to an analog format which is indicative of the velocity of the fluid flowing through the monitored flowline 12 associated with the received flow signal and the frequency to voltage converter 190 can have a range of from 0 volts to 10 volts corresponding to a frequency range of 0 HZ to 255 HZ or other fullscale frequencies.

EMBODIMENT OF FIG. 4

Figure 4B:
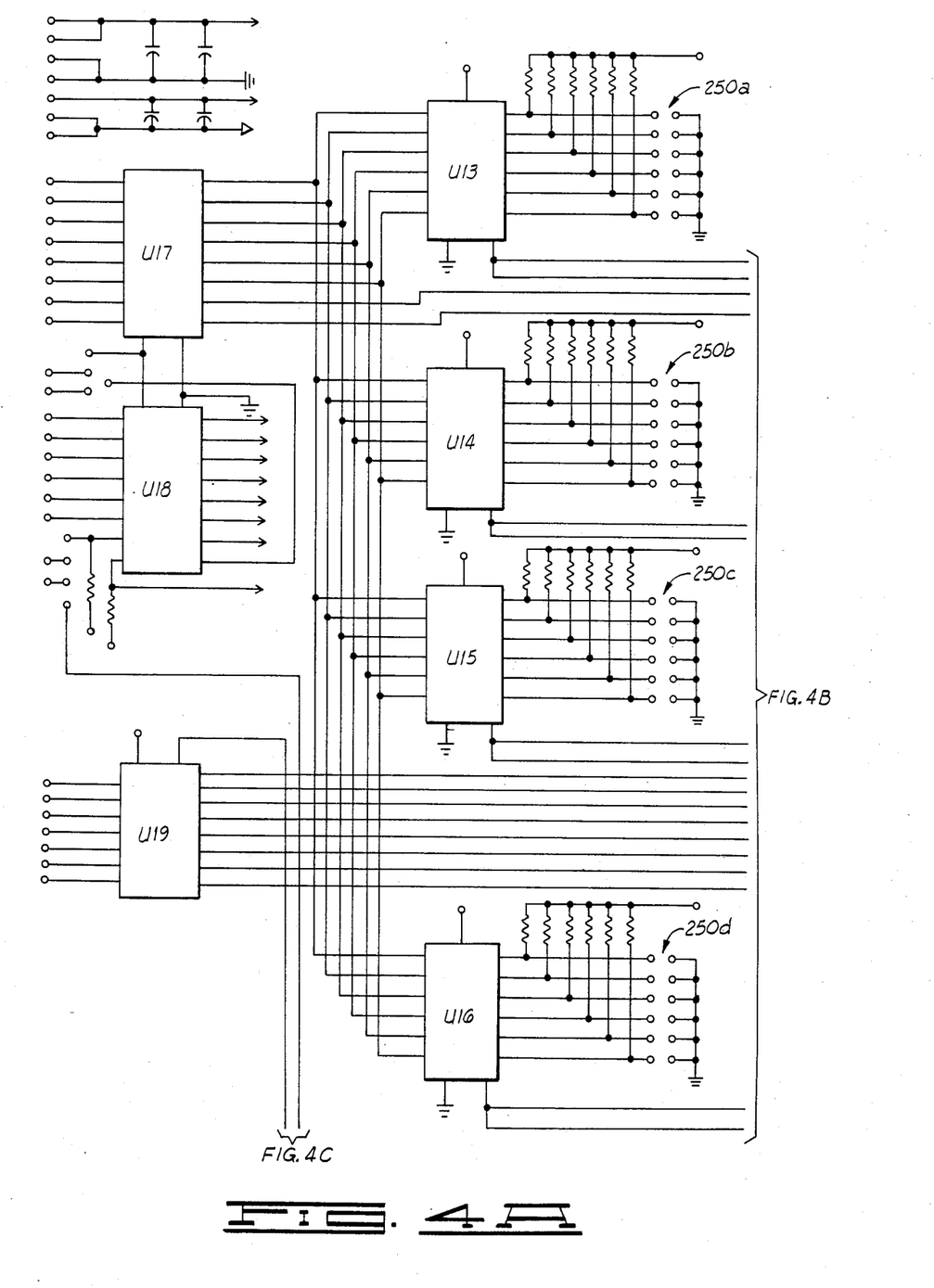
Figure 4C:
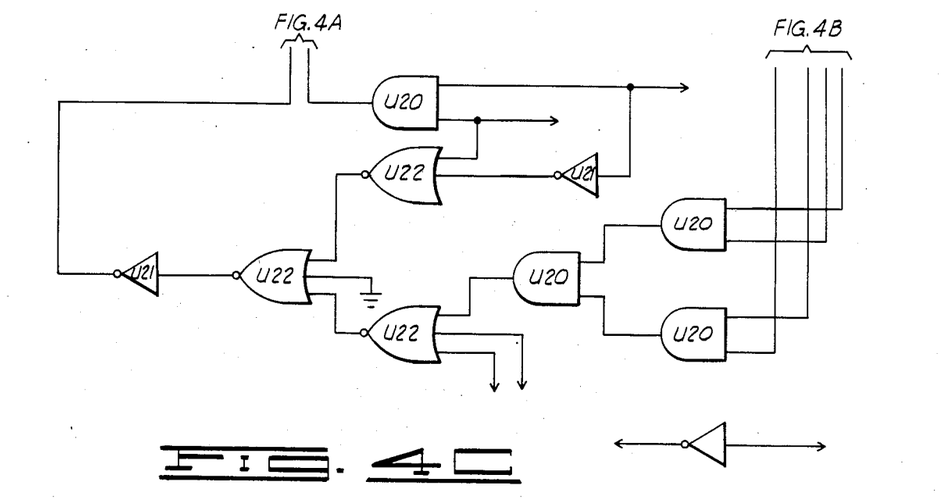
Figure 4D:
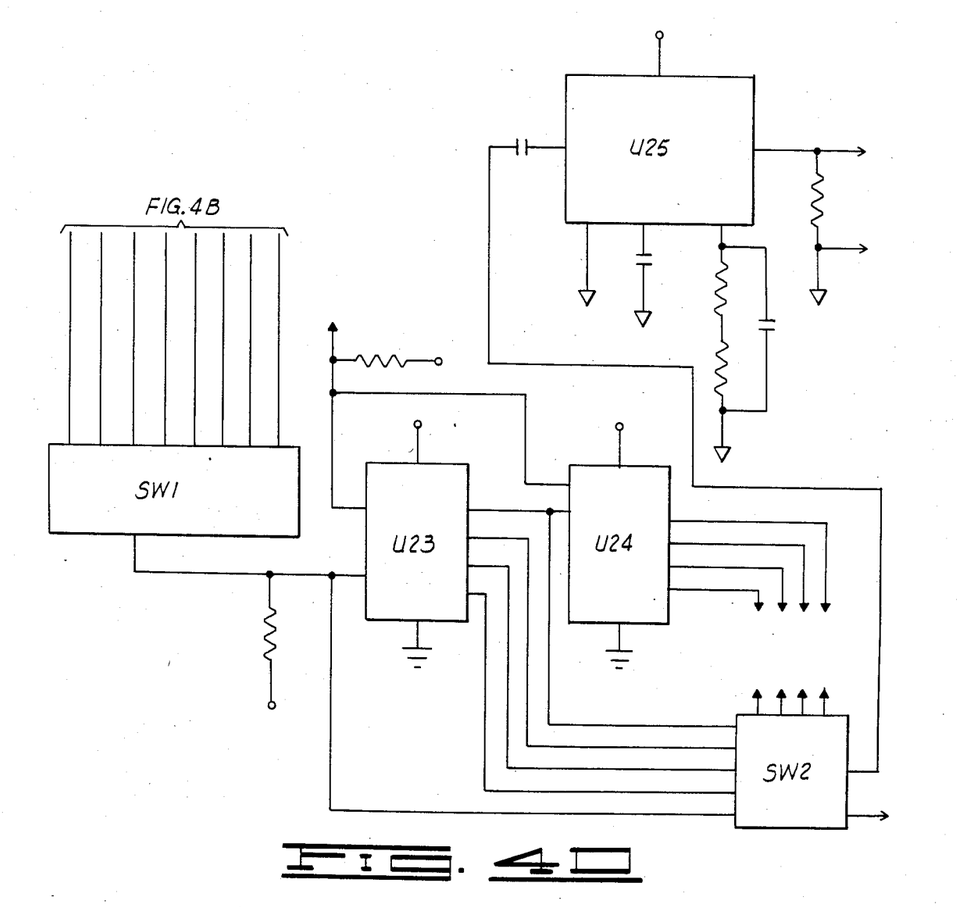

Shown in FIG. 4 is a detailed schematic drawing showing one particular embodiment of the portion of the pulse accumulator network 22 shown in FIG. 3, this embodiment more particularly being shown in FIGS. 4a, 4b, 4c and 4d. With respect to FIG. 4, the major components including the pulse accumulators are identified specifically in Table I below.

TABLE I

| REF. | DESCRIPTION | MODEL NO. | MANUFACTURER |
|---|---|---|---|
| C21 | CAPACITOR | #CZ30CIOSM | CENTRALAB |
| C23 | CAPACITOR | #150D335X9015A2 | SPRAGUE |
| C22 | CAPACITOR | #CZ15C333M | CENTRALAB |
| C19-C20 | CAPACITOR | #501D106M063LL | SPRAGUE |
| C11-C18 | CAPACITOR | #DD-150 | CENTRALAB |
| C1-C10 | CAPACITOR | #CK-103 | CENTRALAB |
| R39 | POTENTIOMETER | #3299X | BOURNS |
| R37-R38 | RESISTOR | #RC07 | ALLAN-BRADLEY |
| R9-R36 | SIP RES NET | #108A | ALLAN-BRADLEY |
| R1-R8 | SIP RES NET | #11CA | ALLAN-BRADLEY |
| U9-U12 | CMOS INTEGRATED CIRCUIT | #TMPZ84C30P | TOSHIBA |
| U13-U16 | CMOS INTEGRATED CIRCUIT | #MM74HC688N | NATIONAL SEMI |
| U17-U19 | CMOS INTEGRATED CIRCUIT | #MM74HCT245N | NATIONAL SEMI |
| U23-U24 | CMOS INTEGRATED CIRCUIT | #MM74HC161N | NATIONAL SEMI |
| U22 | CMOS INTEGRATED CIRCUIT | #MM74HC27N | NATIONAL SEMI |
| U20 | CMOS INTEGRATED CIRCUIT | #MM74HCO8N | NATIONAL SEMI |

TABLE I-continued

| REF. | DESCRIPTION | MODEL NO. | MANUFACTURER |
| --- | --- | --- | --- |
| U21 | CMOS INTEGRATED CIRCUIT | #MM74HCO4N | NATIONAL SEMI |
| U25 | CMOS INTEGRATED CIRCUIT | #LM2907N-8 | NATIONAL SEMI |
| U1-U8 | CMOS INTEGRATED CIRCUIT | #HCPL2602 | HEWLETT-PACKARD |
| TP1-TP4 | PIN | #60599-3 | AMP |
| J4-J9 | HEADER | #9929665-01-36 | APTRONICS |
| J1 | CONNECTOR | #FCC-301-16 | ALPHA |
| J3 | TEST JACK | #325-103 | H.H. SMITH |
| J2 | TEST JACK | #325-102 | H.H. SMITH |
| SW1-SW2 | SWITCH | #1A26300IG | EECO |
| S9-S12 | DIP SOCKET | #528-AG11D | AUGAT |
| S13-S19 | DIP SOCKET | #520-AG11D | AUGAT |
| S23-S24 | DIP SOCKET | #516-AG11D | AUGAT |
| S20-S22 | DIP SOCKET | #514-AG11D | AUGAT |
| S1-S8-S-25 | DIP SOCKET | #50B-AG11D | AUGAT |

In the embodiment shown in FIG. 4, the pulse accumulator network 22 comprises four counter-timer circuits (U9, U10, U11 and U12). Each counter-timer circuit includes four 8-bit downcounters and each pair of two 8-bit downcounters are interconnected (cascaded to provide one 16-bit pulse accumulator. Each 8-bit downcounter is identified by an address code. Thus, in this embodiment, each 8-bit downcounter is polled and the polling of the two 8-bit downcounters constitutes the polling of the 16-bit pulse accumulator.

Each counter-timer circuit also includes four registers with one register being associated with each downcounter. The count in each downcounter is stored (latched) in the register connected thereto.

The pulse accumulator network 22 also includes four address decoders (U13, U14, U15 and U16) comprising the address decoder network 144, and each address decoder is connected to one of the counter-timer circuits. Each address decoder is programmed with a code corresponding to the associated counter-timer circuit connected thereto. This code, along with the 2-bit code on the 2-bit address bus 147 enables one specific 8-bit downcounter on the associated counter-timer circuit.

Figure 5:
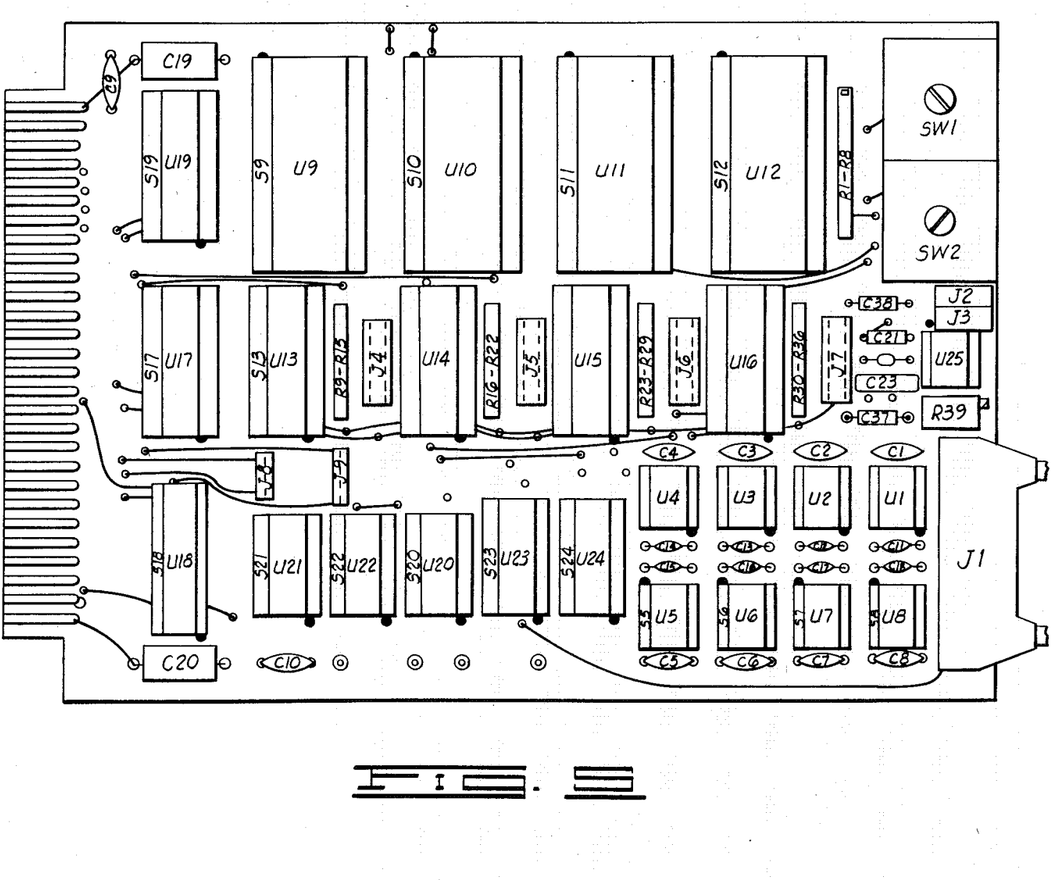
FIG. 5 is a top view of an STD bus compatible double-sided printed circuit board with associated active and passive electrical components of the particular embodiments of the pulse accumulator network of FIGS. 1, 2, 3 and 4.

The code programmed into each address decoder is externally programmed therein by strappable connections as indicated at 250a, 250b 250c and 250d in FIG. 4, and designated in FIG. 5 as J4, J5, J6 and J7. The externally strappable connections permit the code associated with each address decoder to be easily changed and may be selected to be any one of the available 64 address decoders.

In this embodiment, the pulse counter network 120 also includes four registers for vectored interrupt purposes. Each register has a pre-programmed address code which corresponds to one group of two pulse accumulators. Thus, in this embodiment, the interrupt signal actually includes an address code which, when received by the system processor 24, directs the system processor 24 to perform instructions on the specified pulse accumulators or, in other words, the system processor 24 is programmed to poll all of the 8-bit counters in the two pulse accumulators to determine which 8-bit counter has downcounted to zero and, thus, that 8-bit counter along with the other 8-bit counter comprising the pulse accumulator are polled by the system processor 24.

Figure 5A:
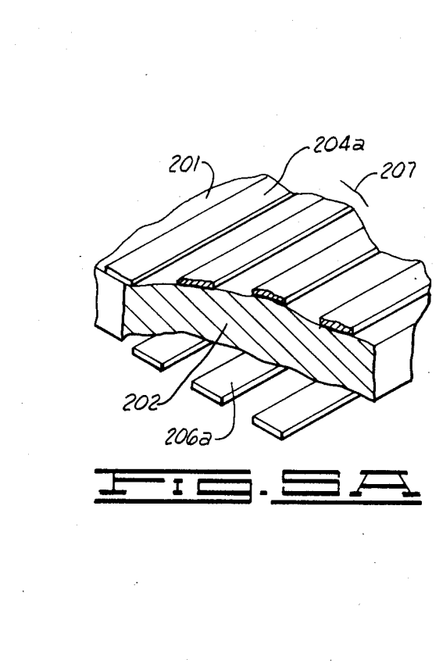
FIG. 5A is a partial perspective view of the STD bus compatible double-sided printed circuit board illustrated in FIG. 5.

EMBODIMENTS OF FIGS. 5 AND 5a

Shown in FIG. 5A is a partial perspective view of a circuit board with STD bus compatible interconnect and one side of the circuit board is illustrated in more detail in FIG. 5. FIGS. 4 and 5 more specifically show the actual circuit board for the components shown in FIG. 4 and identified in Table I above.

As shown in FIG. 5A, an insulating barrier 202 electrically isolates the conductive fingers 204 on the upper surface of the circuit board 201 from the conductive fingers 206 on the lower surface of the circuit board 201. And the portion of the components of the pulse accumulator network 22 shown in FIG. 3 are mounted on the circuit board 201, shown in FIGS. 5 and 5A.

The construction of the pulse accumulator network 22, including the pulse counter network 120, permits the pulse accumulator network 22 to be constructed substantially using CMOS active circuit elements, except for the optical couplers 110 and the frequency to voltage converter 190. All of the bus interface devices, the address buffer 142, the data buffer 124 and the control buffer 128, can be either LSTTL (low power Schottky transistor-transistor logic) or CMOS compatible upon user selection with other modules in a system. The utilization of CMOS technology provides a pulse accumulator network 22 which utilizes a lower power consumption.

Changes may be made in the nature, composition, operation and arrangement of the various elements, steps and procedures described herein without departing from the spirit and scope of the invention as defined in the following claims.

What is claimed is:

1. A flow monitoring system for monitoring fluid flow passing through a plurality of monitored flowlines comprising:

a plurality of information generators, each information generator being operatively connected to one of the monitored flowlines and each information generator detecting the fluid flow passing through the monitored flowline connected thereto and each information generator outputting flow signals in a digital format in a pulse train indicative of the velocity of the fluid passing through the monitored flowline connected thereto;

a pulse accumulator network receiving the flow signals outputted by each of the information generators and accumulating the pulses in each of the received flow signals, each of the accumulated count of pulses being an accumulated flow signal; and a system processor connected to the pulse accumulator network, the system processor outputting polling signals for polling the pulse accumulator network, the pulse accumulator network receiving the polling signals and the pulse accumulator network outputting each accumulated flow signal in response to receiving the polling signals, each accumulated flow signal being indicative of the velocity of the fluid flowing through one of the monitored flowlines.

2. The flow monitoring system of claim 1 wherein the system processor is defined further as outputting the polling signals in a predetermined sequence and at predetermined times to poll each of the count of pulses accumulated in the pulse accumulator network, the count of pulses for each of the received flow signals accumulated in the pulse accumulator network being indicative of the velocity of the fluid flowing through the monitored flowline outputting the particular flow signal counted over a period of time between polling signals, a polling period of time.

3. The flow monitoring system of claim 2 wherein the accumulated flow signal for each monitored flowline is defined further as being proportional to the average velocity of the fluid flowing through the monitored flowline outputting the flow signals counted over the polling period of time.

4. The flow monitoring system of claim 1 wherein the pulse accumulator network is defined further as comprising:
a pulse counter network receiving each of the flow signals outputted by the information generators and counting the pulses in each of the received flow signals and accumulating the count of pulses in each of the flow signals, the accumulated count of the pulses of each of the received flow signals being an accumulated flow signal, the pulse counter network storing each of the accumulated flow signals at a predetermined storage location in the pulse counter network and each of the storage locations being uniquely identified by an address code; and
wherein the system processor is defined further as outputting polling signals at predetermined times and in a predetermined sequence, each polling signal including an address code uniquely identifying one of the storage locations in the pulse counter network, the pulse counter network receiving each of the polling signals and outputting the accumulated flow signal in the storage location identified by the address code in the received polling signal, the processor sequentially outputting polling signals with address codes to poll each of the storage locations in the pulse counter network over a predetermined period of time with each storage location in the pulse counter network being polled at predetermined time intervals, polling periods of time.

5. The flow monitoring system of claim 4 wherein each of the accumulated flow signals is defined further as being indicative of the average velocity of the fluid flowing through the monitored flowline outputting the flow signal associated with the accumulated flow signal over the polling period of time.

6. The flow monitoring system of claim 5 wherein the pulse counter network is defined further to include:
a plurality of pulse accumulators, each pulse accumulator receiving flow signals outputted by one of the information generators and counting the pulses in each of the received flow signals and accumulating the count of pulses in each of the flow signals, the accumulated count of pulses in each of the flow signals being the accumulated flow signal, each pulse accumulator storing each of the accumulated flow signals and each pulse accumulator comprising the predetermined storage location uniquely identified by the address code.

7. The production monitoring system of claim 6 wherein each pulse accumulator is defined further as providing an interrupt signal in response to the accumulated count in the pulse accumulator reaching a predetermined accumulated count, each interrupt signal containing the address code uniquely identifying the particular pulse accumulator outputting the interrupt signal, and wherein the processor is defined further as receiving the interrupt signals from the pulse accumulators in the pulse accumulator network and outputting a polling signal for polling the pulse accumulator identified by the address code in the received interrupt signal.

8. A method for monitoring fluid flow passing through a plurality of monitored flowlines, comprising the steps of:
detecting the fluid flow passing through each of the monitored flowlines and outputting flow signals, each flow signal being in a digital format in a pulse and train and being indicative of the velocity of the fluid passing through one of the monitored flowlines;
receiving the flow signals at a pulse accumulator network and accumulating the pulses in each of the received flow signals at the pulse accumulator network;
outputting polling signals from a system processor for polling the accumulated pulses for each of the received flow signals; and
outputting from the pulse accumulator each of the accumulated pulses, each of the accumulated pulses being an accumulated flow signal, in response to receiving the polling signals, each accumulated flow signal being indicative of the velocity of the fluid flowing through one of the monitored flowlines.

9. The method of claim 8 wherein the step of outputting polling signals is defined further as outputting the polling signals in a predetermined polling sequence and at predetermined times to poll each of the count of pulses accumulated in the pulse accumulator network, the count of pulses for each of the received flow signals accumulated in the pulse accumulator network being indicative of the velocity of the fluid flowing through the monitored flowline outputting the particular flow signal counted over a predetermined period of time between polling signals, a polling period of time.

10. The method of claim 9 wherein the accumulated flow signal for each monitored flowline is defined further as being proportional to the average velocity of the fluid flowing through the monitored flowline outputting the flow signals counted over the polling period of time.

11. The method of claim 8 wherein the step of receiving the flow signals and counting the pulses in each of the received flow signals is defined further to include:
storing each of the accumulated flow signals at a predetermined storage location in the pulse accumulator network, each of the storage locations being uniquely identified by an address code; and
wherein the step of outputting the polling signals is defined further as outputting the polling signals at predetermined times and in a predetermined sequence, each polling signal including an address code uniquely identifying one of the storage locations in the pulse accumulator network, and wherein the step of receiving the polling signals at the pulse accumulator network is defined further as receiving each of the polling signals of the pulse accumulator network and outputting the accumulated flow signal in the storage location identified by the address code in the received polling signal, and wherein the step of output in the polling signals is defined further as outputting the polling signals, including an address code, to poll each of the storage locations in the pulse accumulator network over a predetermined period of time with each storage location in the pulse accumulator network being polled at predetermined time intervals, polling periods of time.

12. The method of claim 11 wherein the step of outputting the accumulated flow signals is defined further as outputting accumulated flow signals indicative of the average velocity of the fluid flowing through the monitored flowline outputting the flow signal associated with the accumulated flow signal over the predetermined period of time.

13. An apparatus for receiving a plurality of pulse trains wherein each pulse train includes a plurality of pulses, comprising:
a circuit board having an STD bus compatible interconnect on a portion thereof; and
a pulse accumulator network mounted on the circuit board and connected to the STD bus compatible interconnect, the pulse accumulator network being adapted to receive one each of the pulse trains, count the pulses in each of the received pulse trains and accumulate the count of pulses in each of the received pulse trains (an accumulated count), the pulse accumulator network storing each accumulated count at a predetermined storage location in the pulse accoumulator network and each storage location being uniquely identified by an address code, the pulse accumulator being adapted to output each of the accumulated counts in response to receiving a polling signal.

14. The apparatus of claim 13 wherein the pulse accumulator network is defined further to include:
a plurality of pulse accumulators, each pulse accumulator receiving one of the pulse trains and counting the pulses in the received pulse train and accumulating the count of pulses in the received pulse train (an accumulated count), the pulse accumulators storing each of the accumulated counts at a predetermined storage location defined by the pulse accumulator and each storage location being uniquely identified by an address code, each pulse accumulator outputting the accumulated count therein in response to receiving a polling signal.

15. The apparatus of claim 14 wherein the plurality of pulse accumulators is defined further as being eight pulse accumulators.

16. The apparatus of claim 14 defined further to include:
an address decoder network for receiving address codes, the address decoder network having externally strappable encoded address codes and the address decoder network receiving an address code and comparing the received address code with one of the address codes and outputting an enable signal in response to a comparison for enabling the pulse accumulator identified by the received address code.

17. The apparatus of claim 13 wherein the electrical components in the pulse accumulator network are defined further as being substantially CMOS components.

18. A method for making an apparatus for receiving a plurality of pulse trains with each pulse train having a plurality of pulses, the method comprising the steps of:
providing a circuit board having an STD bus compatible interconnect formed on a portion thereof; and
mounting a pulse accumulator network on the circuit board, the pulse accumulator network being adapted to receive each of the pulse trains, count the pulses in each of the received pulse trains and accumulate the count of pulses in each of the received pulse trains, the pulse accumulator network storing each of the accumulated count of pulses at a predetermined storage location in the pulse accumulator and each of the storage locations being uniquely identified by an address code.

19. The method of claim 18 wherein the pulse accumulator network is defined further as including a plurality of pulse accumulators with each pulse accumulator defining one of the storage locations in the pulse accumulator network, each pulse accumulator receiving one of the pulse trains, counting the pulses in the received pulse train and accumulating the count of pulses in the received pulse train, and each pulse accumulator outputting the accumulated count of pulses stored therein in response to receiving a polling signal.

* * * * *